US008258056B2

(12) United States Patent
Chang

(10) Patent No.: US 8,258,056 B2
(45) Date of Patent: *Sep. 4, 2012

(54) METHOD AND MATERIAL FOR FORMING A DOUBLE EXPOSURE LITHOGRAPHY PATTERN

(75) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/814,172

(22) Filed: Jun. 11, 2010

(65) Prior Publication Data

US 2011/0008968 A1 Jan. 13, 2011

Related U.S. Application Data

(62) Division of application No. 11/563,805, filed on Nov. 28, 2006, now Pat. No. 7,759,253.

(60) Provisional application No. 60/821,605, filed on Aug. 7, 2006.

(51) Int. Cl.
*H01L 21/00* (2006.01)

(52) U.S. Cl. ........ 438/636; 438/704; 438/726; 438/756; 438/780; 257/E21.021; 257/E21.028; 257/E21.085; 257/E21.252; 257/E21.259; 257/E23.019; 257/E23.167; 257/E27.103

(58) Field of Classification Search .................. 438/636, 438/704–780; 257/E21.024, E21.028–E21.035, 257/252–259, 579, 23.019, 167, 27.103
See application file for complete search history.

(56) References Cited

U.S. PATENT DOCUMENTS

| | | | |
|---|---|---|---|
| 4,426,247 A | 1/1984 | Tamamura et al. | |
| 5,858,620 A | 1/1999 | Ishibashi et al. | |
| 6,207,576 B1* | 3/2001 | Wang et al. | 438/706 |
| 6,277,752 B1 | 8/2001 | Chen | |
| 6,296,780 B1* | 10/2001 | Yan et al. | 216/67 |
| 6,361,928 B1 | 3/2002 | Yang et al. | |
| 6,436,587 B1* | 8/2002 | Ulrich et al. | 430/5 |
| 6,492,075 B1 | 12/2002 | Templeton et al. | |
| 6,536,063 B1 | 3/2003 | Blasé et al. | |
| 6,576,562 B2 | 6/2003 | Ohuchi et al. | |
| 6,593,063 B1 | 7/2003 | Ttanaka et al. | |
| 6,605,413 B1* | 8/2003 | Lyons et al. | 430/314 |
| 6,660,456 B2* | 12/2003 | Wiltshire | 430/314 |
| 6,780,708 B1* | 8/2004 | Kinoshita et al. | 438/241 |
| 6,830,850 B1* | 12/2004 | Krivokapic et al. | 430/1 |
| 7,087,498 B2* | 8/2006 | Pita et al. | 438/359 |
| 7,314,691 B2 | 1/2008 | Hata et al. | |
| 7,335,585 B2* | 2/2008 | Choi | 438/636 |
| 7,365,018 B2* | 4/2008 | Higashitani et al. | 438/717 |

(Continued)

OTHER PUBLICATIONS

Taiwanese Patent Office, Office Action dated Oct. 26, 2010, Application No. 096122646, 5 pages.

(Continued)

*Primary Examiner* — Michael Lebentritt
(74) *Attorney, Agent, or Firm* — Haynes and Boone, LLP

(57) ABSTRACT

A method of lithography patterning includes forming a first material layer on a substrate; forming a first patterned resist layer including at least one opening therein on the first material layer; forming a second material layer on the first patterned resist layer and the first material layer; forming a second patterned resist layer including at least one opening therein on the second material layer; and etching the first and second material layers uncovered by the first and second patterned resist layers.

20 Claims, 11 Drawing Sheets

U.S. PATENT DOCUMENTS

| | | | |
|---|---|---|---|
| 7,384,874 B2 * | 6/2008 | Jung | 438/700 |
| 7,393,777 B2 * | 7/2008 | Cooney et al. | 438/637 |
| 7,473,648 B2 * | 1/2009 | Brunner et al. | 438/717 |
| 7,662,721 B2 * | 2/2010 | Manger et al. | 438/717 |
| 7,666,794 B2 * | 2/2010 | Lin | 438/717 |
| 7,713,818 B2 * | 5/2010 | Chan | 438/257 |
| 7,732,235 B2 * | 6/2010 | Scheuerlein et al. | 438/39 |
| 7,759,253 B2 * | 7/2010 | Chang | 438/706 |
| 7,803,521 B2 * | 9/2010 | Chen et al. | 430/330 |
| 7,807,583 B2 * | 10/2010 | Van Aelst et al. | 438/717 |
| 2002/0036183 A1 | 3/2002 | Shibata | |
| 2002/0064958 A1 | 5/2002 | Takeuchi | |
| 2003/0003716 A1 | 1/2003 | Kim | |
| 2003/0134231 A1 | 7/2003 | Tsai et al. | |
| 2004/0033445 A1 | 2/2004 | Lee et al. | |
| 2005/0197721 A1 | 9/2005 | Chen et al. | |
| 2005/0260848 A1 | 11/2005 | Sreenivasan | |
| 2006/0257791 A1 | 11/2006 | Kim et al. | |
| 2007/0037410 A1 * | 2/2007 | Chang et al. | 438/780 |
| 2007/0148968 A1 * | 6/2007 | Kwon et al. | 438/671 |
| 2010/0099255 A1 * | 4/2010 | Conley et al. | 438/675 |
| 2010/0120258 A1 * | 5/2010 | Kim | 438/745 |
| 2010/0290285 A1 * | 11/2010 | Lee et al. | 365/185.05 |
| 2011/0070738 A1 * | 3/2011 | Liang et al. | 438/702 |
| 2011/0159693 A1 * | 6/2011 | Sun | 438/703 |

OTHER PUBLICATIONS

Park, Sang-Jin, et al., "Chemically Amplified Silicon Containing Resist for Electron Beam Lithography," Journal of the Korean Physical Society, vol. 35., Dec. 1999, pp. S725-S728.

Rottstegge, Jorg et al., "Ultra thin film imaging at 157 nm," Infineon Technologies AG, Polymer Materials and Technology, Erlangen Germany, 9 pages.

Somervell, Mark, Background on Thin Layer Imaging, Excerpts from PhD thesis, 9 pages.

Lin, Qinghuang, et al., "A High Resolution 248 nm Bilayer Resist," IBM Almaden Research Center, San Jose, CA 95120, SPIE conference on Advances in Resist Technology and Processing XVI, Santa Clara, CA, Mar. 1999, vol. 3678, 0277-786X/99/$10.00, abstract, p. 241, 1 page.

Babich, Katherina, et al., "Effects of underlayer on performance of bilayer resists for 248nm lithography," IBM T. J. Watson Research Center, Yorktown Heights, NY 10598, SPIE vol. 3333, abstract, p. 726, 1 page.

Kessel, Carl L., et al., "Novel Silicon-Containing Resists for EUV and 193 nm Lithography," 3M Company, St. Paul, MN 55144, SPIE Conference on Advances in Resist Technology and Processing XVI, Santa Clara, CA, Mar. 1999, SPIE vol. 3678, 02077-786X/00/$10.00, abstract, p. 214, 1 page.

Sooriyakumaran, Ratnam, et al., "Positive Bilayer Resists for 248 and 193 nm Lithography," IBM Almaden Research Center, San Jose, CA 95120, SPIE vol. 3333/219, 0277-786X/98/$10.00, abstract, 1 page.

Postnikov, Sergie V., et al., "Tp Surface Imaging Through Silylation," Dept. of Chemical Engineering, The University of Texas, Austin, TX 78712, SPIE vol. 3333/997, 0277-786X/98/$10.00, abstract, 1 page.

* cited by examiner

1st PR pattern

2nd PR pattern

Under layer open

PR pattern / Silicon / Underlayer

PR pattern / Silicon / PR pattern / Silicon / Underlayer

Silicon / Underlayer / substrate top layer open

Substrate etch

Under layer removal

PR pattern / Silicon / PR pattern / Silicon / Underlayer

Underlayer / substrate substrate

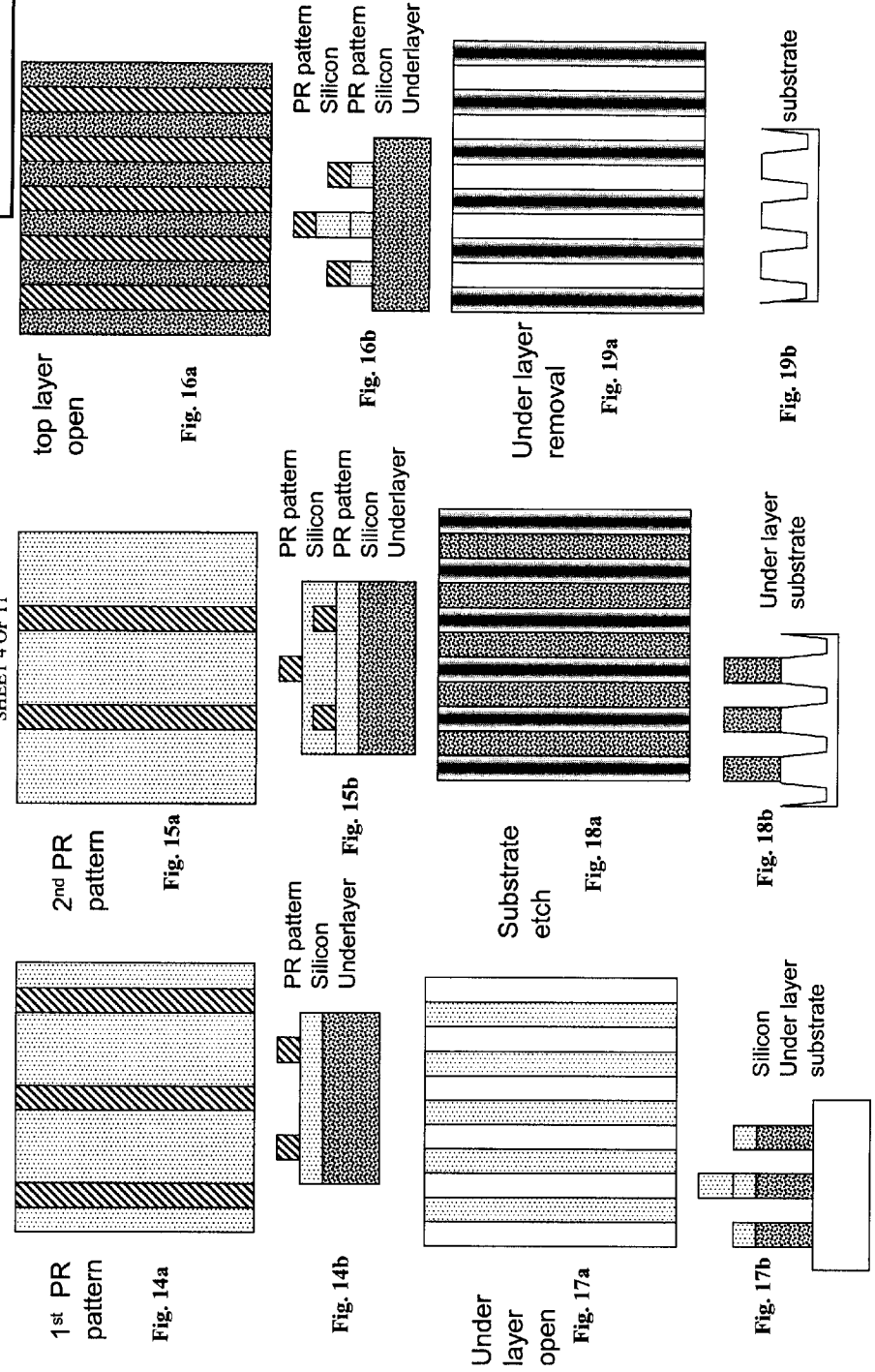

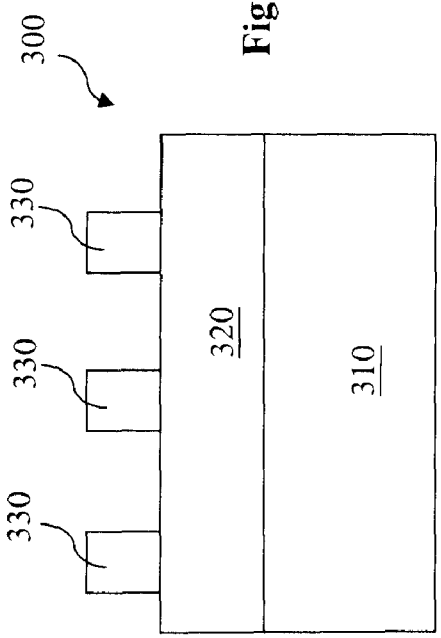
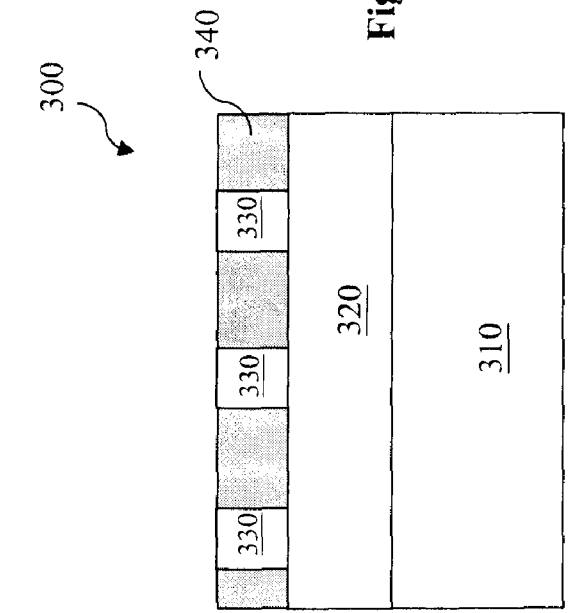
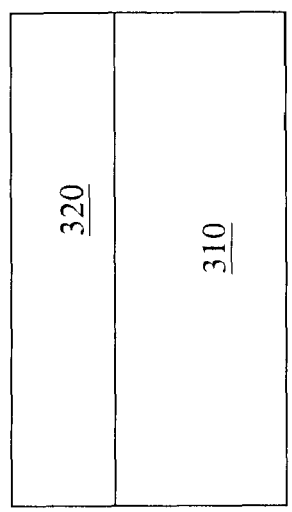
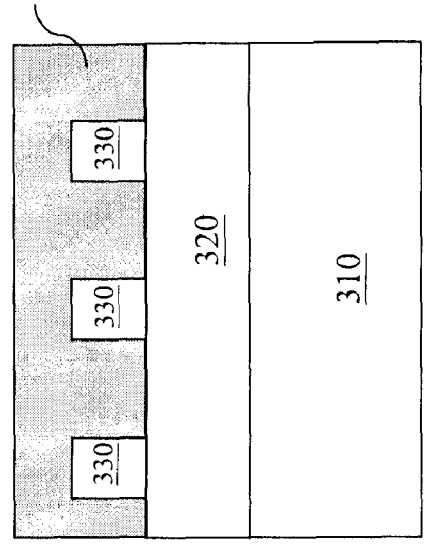

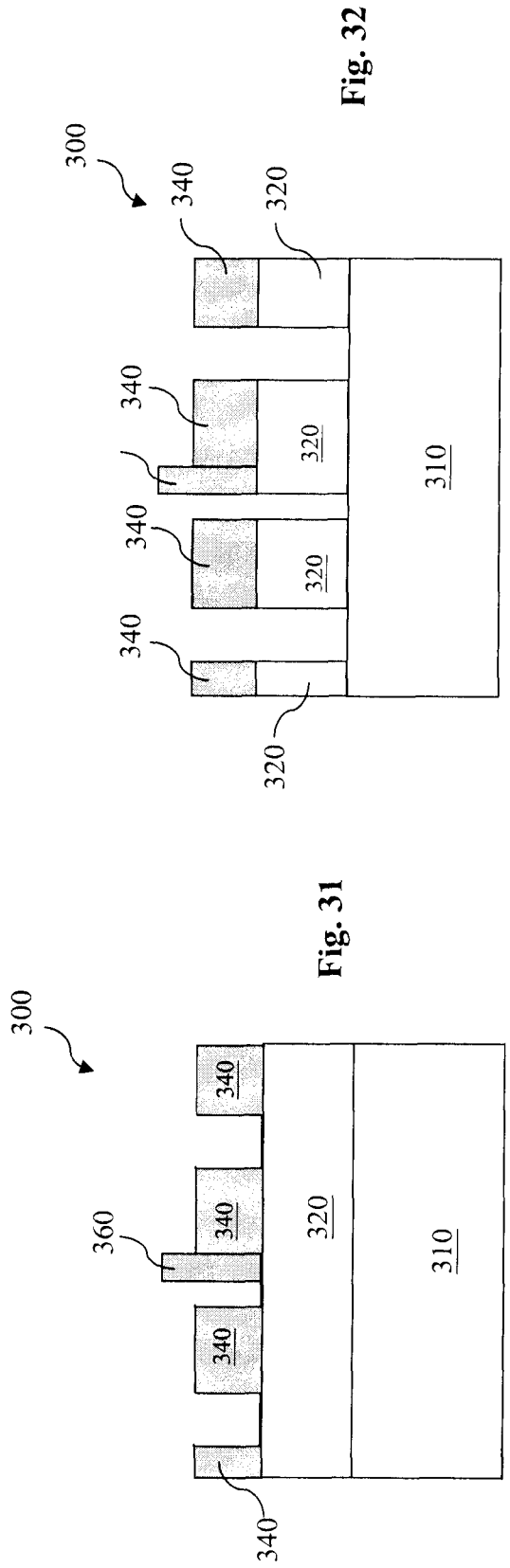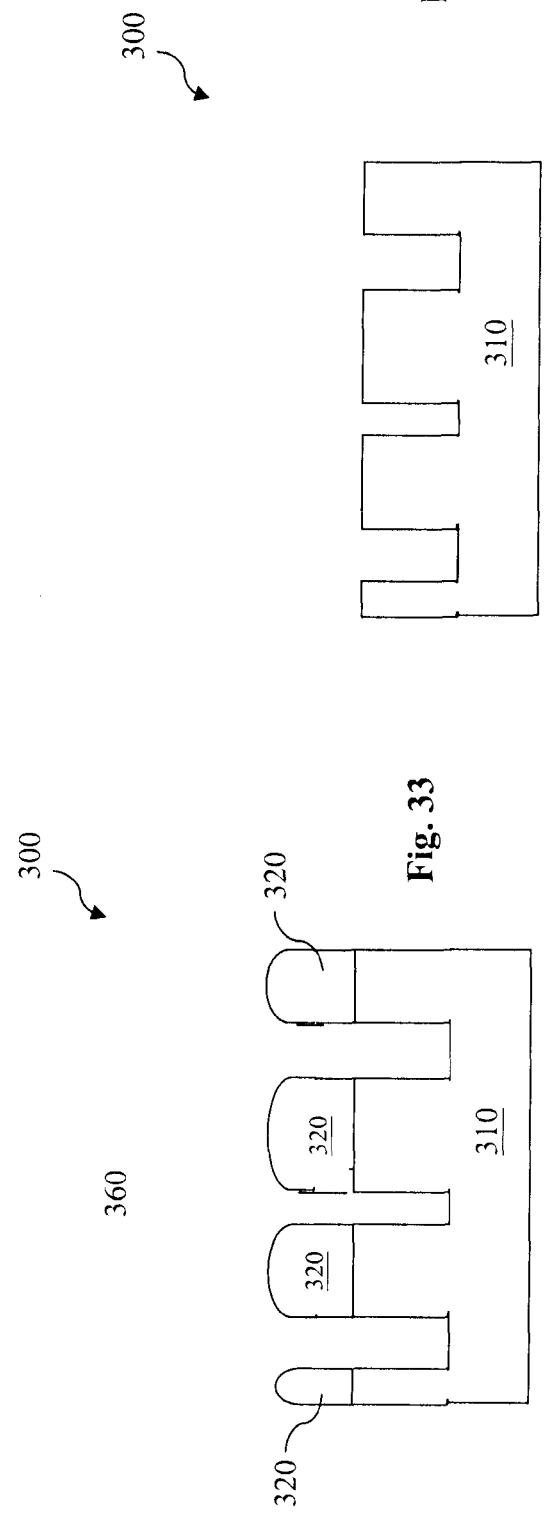

METHOD AND MATERIAL FOR FORMING A DOUBLE EXPOSURE LITHOGRAPHY PATTERN

The present application is a divisional of U.S. patent application Ser. No. 11/563,805, filed Nov. 28, 2006, now U.S. Pat. No. 7,759,253, issued Jul. 20, 2010, which claims the benefit of U.S. Provisional Patent Application Ser. No. 60/821,605, filed Aug. 7, 2006, the entire disclosures of which are incorporated herein by reference. The present disclosure is related to U.S. patent application Ser. No. 11/426,233, filed Jun. 23, 2006, now U.S. Pat. No. 7,482,280, issued Jan. 27, 2009, which is claims the benefit of U.S. Provisional Patent Application Ser. No. 60/708,208, filed Aug. 15, 2005, the entire disclosures of which are incorporated herein by reference.

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons. For example, a resist layer may experience pattern collapse and CD degradation during a lithography patterning process. When double patterning techniques are utilized, additional issues may be brought out, such as profile scum, high manufacturing cost, and round corners.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 8a through 13a and FIGS. 8b through 13b are top views and sectional views, respectively, of another embodiment of a device during various fabrication stages.

FIGS. 14a through 19a and FIGS. 14b through 19b are top views and sectional views, respectively, of yet another embodiment of a device during various fabrication stages.

FIGS. 23 through 34 are sectional views of another embodiment of a device during various fabrication stages.

DETAILED DESCRIPTION

Figure 2:
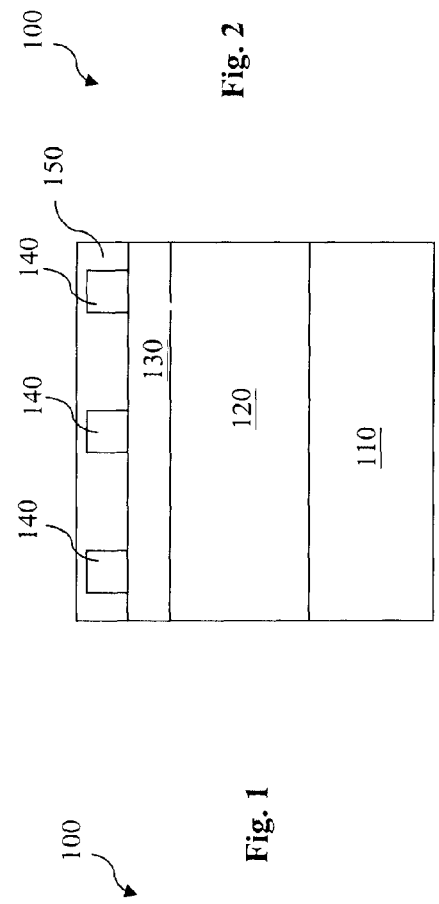
FIGS. 1 through 7 are sectional views of one embodiment of a device during various fabrication stages.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-7 are sectional views showing one embodiment of a device 100 during various fabrication stages. With reference to FIGS. 1-7, a method for lithography patterning is described.

Figure 1:
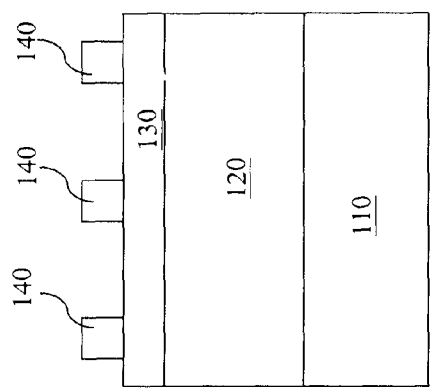

FIG. 1 shows a semiconductor device 100 having a silicon substrate 110. The substrate 110 may alternatively be made of some other suitable semiconductor material, including Ge, SiGe, or GaAs. Further, the substrate 110 may alternatively be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. The substrate 110 may include various doped regions, dielectric features, and multilevel interconnects. The substrate 110 may alternatively be a non-semiconductor material, such as a glass substrate for thin-film-transistor liquid crystal display (TFT-LCD) devices, or fused quartz or calcium fluoride for a photomask (mask or reticle). The substrate 110 may include a layer to be patterned such as a dielectric layer, a semiconductor layer, or a poly-silicon layer.

An underlying material layer (also referred to as an "under-material" layer or simply "material" layer) 120 is formed on the substrate 110. The material layer 120 may function as a hard mask and/or a bottom anti-reflective coating (BARC). The material layer has a thickness ranging between about 50 angstroms and 9000 angstroms in one embodiment. For example, the thickness of the under-material layer 120 can be about 500 angstroms. In another embodiment, the material layer 120 has a thickness ranging between about 1000 angstroms and 3500 angstroms. Further, the material layer 120 may have other parameters that fall within selected ranges. For example, the material layer 120 has a refractive index in a range between about 1 and 3, and an extinction coefficient (absorption value) κ in a range between about 0.01 and 1.0. Alternatively, the material layer 120 may have a refractive index of about 1.75 and an extinction coefficient of about 0.5.

In the present embodiment, the material layer 120 includes an organic polymer. The material layer 120 may be substantially free of silicon and/or substantially free of hydroxyl groups and carboxyl groups. The material layer 120 may include a photoresist (or resist) that is either a positive-type or negative-type, with or without photosensitive material. The material layer 120 may include a proper BARC material and may further have a top layer to cover the BARC material. The top layer may be about 50 angstroms thick, and substantially free of hydroxyl groups and carboxyl groups. The material layer 120 may include conventional polymer material or resist material. For example, the material layer may be one of t-Butyloxycarbonyl (t-BOC) resist, acetal resist, and environmentally stabilized chemically amplified photoresist (ESCAP) that are known in the art. For the material layer 120 made of polymeric material, the polymeric material may be cross-linked. For example, the polymeric material can be spin-on coated to the substrate 110 and then cross-linked using a baking process with temperature ranging between about 90° C. and 300° C. Alternatively, this temperature range could be about 100° C. to 180° C. Alternatively, the polymeric material may not be cross-linked, and in that case the material layer 120 may use a solvent that is not capable of dissolving a resist layer or not dissolved by the resist layer formed above the material layer 120. For example, the material layer 120 may use butanol as a solvent.

Alternatively, the material layer 120 may use other suitable materials that are different from a protective layer that is to be formed above the material layer 120 to protect a resist pattern on the material layer 120. For example, the material layer 120 may include silicon nitride or silicon oxynitride in order to be different from a protective layer containing silicon oxide, in which the two layers have substantially different etching rates during an etching process.

A middle layer 130 is formed on the material layer 120. The middle layer 130 includes a silicon-containing organic polymer, which may use a solvent different from that of the resist layer. The solvent of the middle layer is not capable of dissolving a resist layer. For example, the middle layer can use butanol, isobutanol, isopentanol and/or IPA as a solvent. The polymeric material may be cross-linked. The middle layer 130 may include a silicon-containing inorganic polymer. For example, the inorganic polymeric material may include silicon oxide. The middle layer 130 may include a metal-containing organic polymer material that contains metal such as titanium, titanium nitride, aluminum, and tantalum. In another embodiment, the middle layer 130 may include silicon nitride or silicon oxynitride. The middle layer 130 may include pure silicon such as polycrystalline silicon or silicon oxide. For example, the middle layer 130 may include spin-on glass (SOG) known in the art. The middle layer 130 may be thermally baked for cross-linking, thus without further requiring the solvent. The middle layer 130 may have a thickness ranging between about 500 and 2000 angstroms, or alternatively a range between about 800 and 900 angstroms.

A patterned resist layer 140 is then formed on the middle layer 130. Resist layer 140 includes a plurality of openings, such that portions of the middle layer 130 are uncovered within the openings. The openings of the resist layer 140 are configured according to a predetermined pattern. The resist layer 140 may have a thickness ranging between about 50 angstroms and 5000 angstroms. Alternatively, the resist layer 140 may have a thickness ranging between about 500 angstroms and 3000 angstroms, or ranging between about 1000 angstroms and 1500 angstroms. The resist layer 140 can be a positive-type resist or a negative-type resist. For advanced semiconductor patterning using an extreme ultraviolet (EUV) radiation beam, the resist layer 140 may use a chemical amplification (CA) resist. The patterned resist layer 140 is formed by a lithography process that may include processing steps of resist coating, soft baking, mask aligning, exposing, post-exposure baking, developing, and hard baking. For illustration, the exposing process may be carried out by exposing the semiconductor device 100 under a radiation beam through a mask having a predefined pattern (or a reversed pattern). The radiation beam may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, electron-beam writing, ion-beam writing, and molecular imprint techniques. The patterned resist layer 140 may include acid molecular or radiation-sensitive acid generator, such that acid can be generated when a radiation beam is applied.

The patterned resist layer 140 may be further processed using a hardening process. The hardening process may include plasma treatment, ultraviolet (UV) curing, ion implant bombard, e-beam treatment, or combinations thereof.

Referring to FIG. 2, a top layer 150 is formed on the patterned resist layer 140 and in the openings thereof. The top layer substantially fills the openings in the patterned resist layer 140. The top layer 150 substantially covers portions of the middle layer 130 that are exposed within the openings in the patterned resist layer 140. The top layer 150 may include a silicon-containing organic polymer, which may use a solvent different from that of the resist layer. The solvent of the top layer is not capable of dissolving the resist layer 140. The top layer may utilize an alcohol based solvent. For example, the top layer can use butanol, isobutanol, isopentanol and/or IPA as a solvent. The polymeric material may be cross-linked. The top layer 150 may include a silicon-containing inorganic polymer. For example, the inorganic polymeric material may include silicon oxide. The top layer 150 may alternatively include a metal-containing organic polymer material that contains metal such as titanium, titanium nitride, aluminum, and tantalum. The metal-containing material used for the top layer may include Ti, TiN, Al, AlOx, W, WSi, or WOx. In another embodiment, the top layer 150 may include silicon nitride or silicon oxynitride. The top layer 150 may include pure silicon such as polycrystalline silicon or silicon oxide. For example, the top layer 150 may include spin-on glass (SOG) known in the art.

Figure 3:
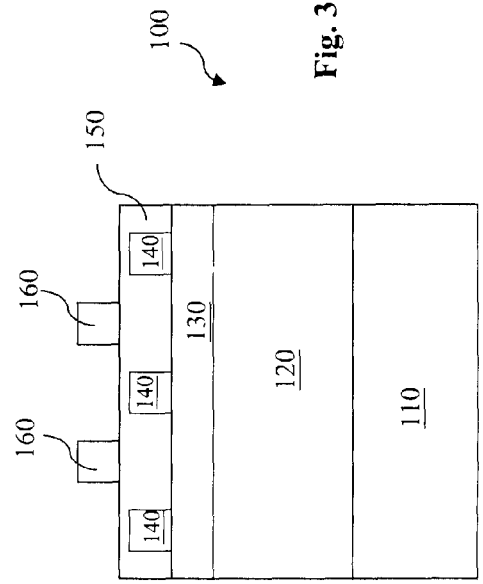

Referring to FIG. 3, another patterned resist layer 160 is then formed on the top layer 150. Resist layer 160 includes a plurality of openings, such that portions of the top layer 150 are exposed within the openings. The patterned resist layer 160 may be substantially similar to the resist layer 140 discussed above, in terms of function, formation, and composition. The openings in the patterned resist layer 160 may be configured relative to the openings of the patterned resist layer 140 so that a double patterning technique can be utilized. For example, the openings in the patterned resist layers 140 and 160 may be configured to achieve pitch splitting. In another example, the openings in the patterned resist layers 140 and 160 may be configured to form various contact holes.

Figure 4:
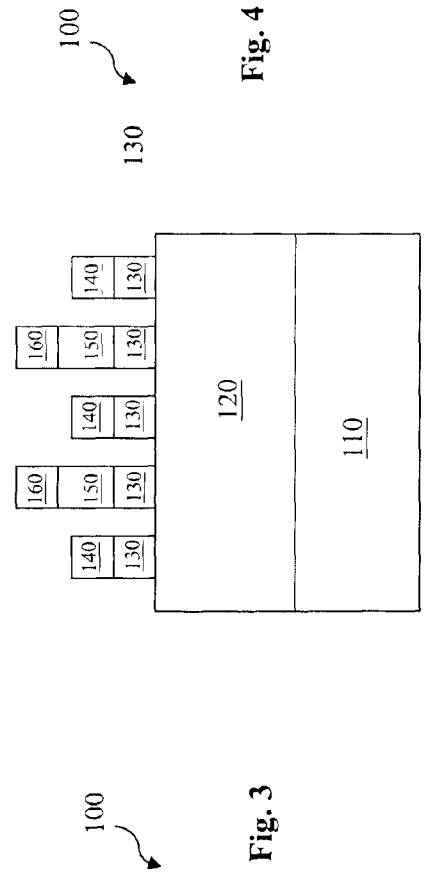

Referring to FIG. 4, an etching process is applied to remove material of the middle layer 130 and the top layer 150 within the openings of the patterned resist layers 140 and 160. The etch process may use a $CF_4$, $C_3F_8$, $C_4F_8$, $CHF_3$, or $CH_2F_2$ dry etch, or a buffered hydrofluoric acid (BHF) wet etch to etch silicon dioxide in various examples. Since both the middle layer 140 and the top layer 160 may include a silicon-containing or a metal-containing material, it is possible to choose a proper etchant that will concurrently remove material of both layers 130 and 150, to expose portions of the material layer 120 located within the openings of the patterned resist layers 140 and 160.

Figure 5:
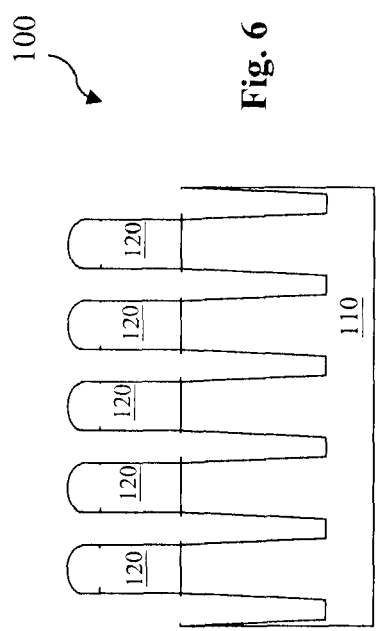

Referring to FIG. 5, an etching process is applied to the material layer 120. The etching process is chosen so that the material layer 120 has a higher etch rate than the middle layer 130 and the top layer 150. In another example, if the material layer 120 includes organic material such as a resist material, oxygen may be chosen as the etchant in order to remove the under layer 120 during a plasma etching. When the material layer 120 is similar to a resist material, the patterned resist layers 140 and 160 may also be consumed during etching of the material layer 120. The silicon material inside the middle and top layers 130 and 150 may react under the oxygen plasma to form silicon oxide, which has a high etching resistance during the etching process. In another example, if the middle layer includes silicon oxide, the silicon oxide would provide an etching resistance. In another example, if the middle and top layers include titanium, titanium nitride, tantalum, aluminum, metal ion, metal complex, organic metal, or a combination thereof, then metal oxide may be formed and provide an etching resistance. The etching process may alternatively be implemented using a nitrogen plasma or a mixture of oxygen, hydrogen, carbon fluoride, carbon bromide and nitrogen plasma, during which silicon-containing material in the middle and/or top layers will be transformed into an associated nitride or oxynitride.

Figure 6:
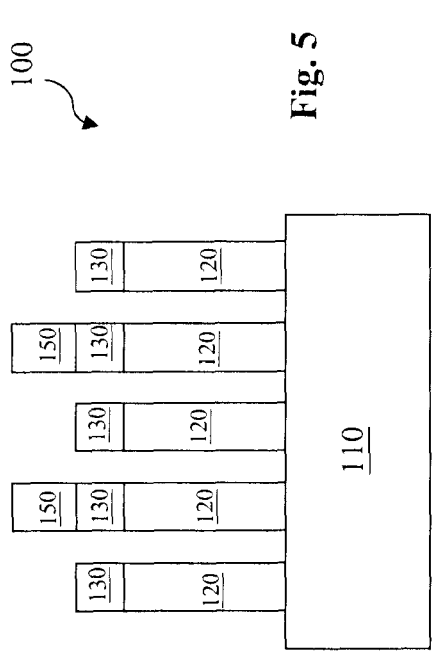
Figure 7:
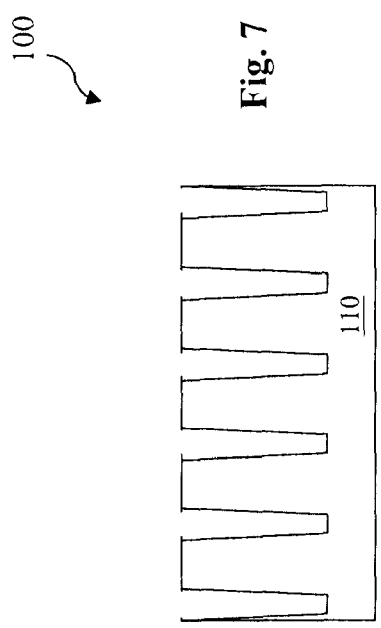
Figure 8A:
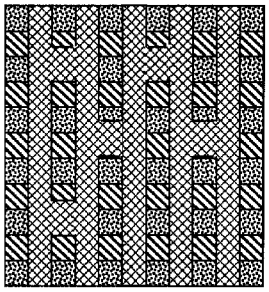
Figure 9A:
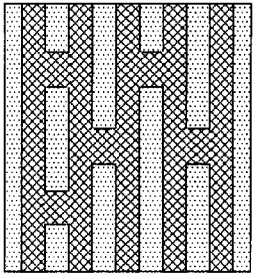
Figure 11A:
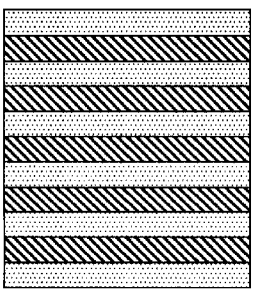
Figure 8B:
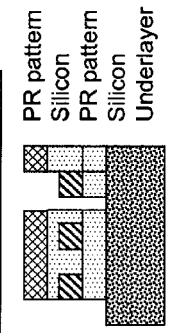
Figure 9B:
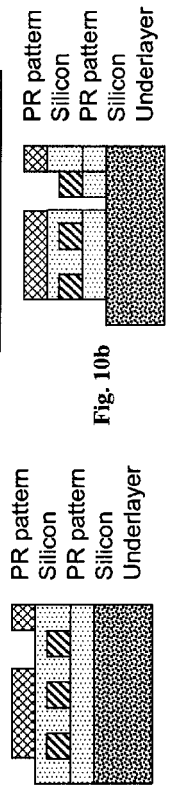
Figure 11B:
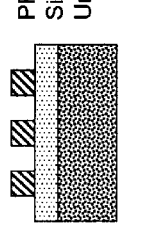
Figure 10A:
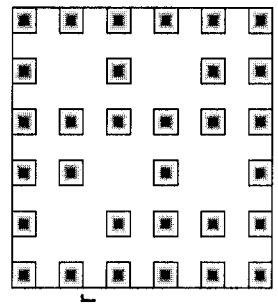
Figure 12A:
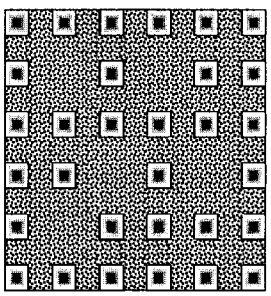
Figure 13A:
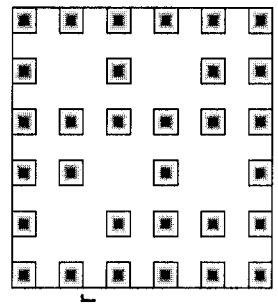
Figure 10B:
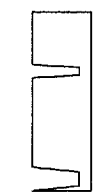
Figure 12B:
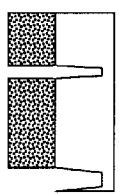
Figure 13B:

Referring to FIG. 6, the substrate 110 is etched through the patterned material layer 120 to form a plurality of trenches, using a suitable etching process including a dry etch or a wet etch. At least some of the material layer 120 may be consumed during the etching process. The remainder of the material layer 120 is thereafter removed, as illustrated in FIG. 7.

The method described above with reference to FIGS. 1 to 7 provides a double patterning process. This process achieves double exposure and single etch to the middle and top layers. This can reduce manufacturing cost and minimize CD variation. The process may be utilized in various applications. In one example, a plurality of contact holes may be formed, as illustrated in various fabrication stages in the top views of FIGS. 8a to 13a, and the corresponding sectional views of FIGS. 8b to 13b. Alternatively, a plurality of line features with split pitch may be formed, as illustrated in various fabrication stages in the top views of FIGS. 14a to 19a, and the corresponding sectional views of FIGS. 14b to 19b.

Figure 20:
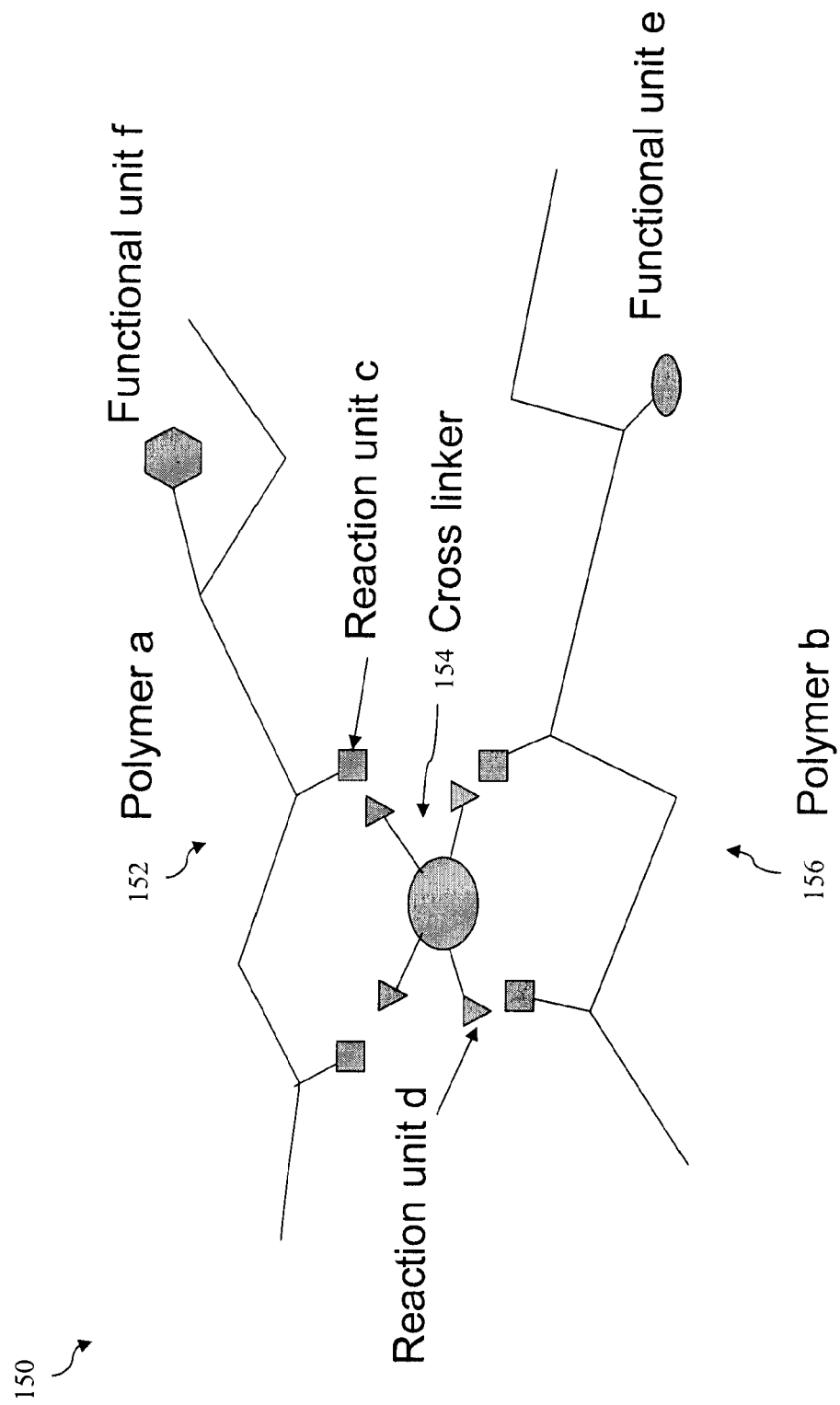
FIG. 20 is a schematic view of a top layer utilized in the embodiment of FIGS. 1 through 7.

The top layer 150 used in the above-described process is further explained in association with FIG. 20. The top layer 150 may have a refractive index ranging from about 1.1 to 1.9 and a absorption value ranging from about 0.001 to 0.8. In one example, the refractive index is about 1.8, and the absorption value is about 0.2. The top layer 150 may have a silicon content that is more than about 20% by weight. The top layer 150 may also have a cure temperature that is less than about 150° C.

Figure 21B:
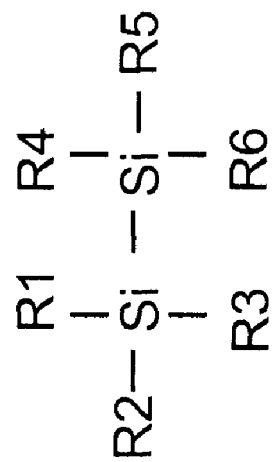
FIGS. 21a and 21b are schematic views showing different embodiments of part of the top layer of FIG. 20.
Figure 21A:
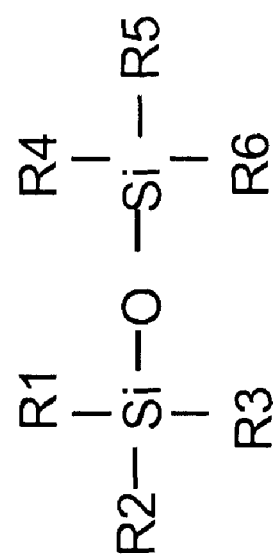

With reference to FIG. 20, the top layer 150 includes a first polymer 152. The first polymer 152 further includes a functional unit "f" capable of enhancing etching resistance during an etching process. This functional unit f may include a tertiary carbon structure, a double bond, a triple bond, or combinations thereof. The first polymer 152 also includes a reaction unit "c" that is capable of reacting to a cross-linker. The reaction unit c may include a functional group such as OH, COOH, anhydride, or combinations thereof. The first polymer 152 may include a backbone unit such as those illustrated in FIGS. 21a and 21b. The backbone units Si—O or Si—Si can be repeated and/or combined. In FIG. 21a, R1 to R6 may each be hydrogen, a halide atom, a straight alkyl, a branched alkyl, a cyclic alkyl, a fluorinated alkyl group, a silicon oxide alkyl, or a silicon alkyl of about 1 to 10000 atom unit. In FIG. 21b, R1 to R6 may each be hydrogen, a fluorine atom, a straight alkyl, a branched alkyl, cyclic alkyl, a fluorinated alkyl group, a silicon oxide alkyl, or a silicon alkyl of about 1 to 10000 atom unit.

Referring again to FIG. 20, the top layer 150 further includes a cross-linker 154 with various reaction units "d" capable of reacting with the first polymer 152 and other polymers if present. The reaction unit d may include a functional group such as OH, COOH, anhydride, or combinations thereof. The cross-linking temperature (cure temperature) ranges between about 100° C. and 250° C. The baking temperature may be about 150° C., for example. The cross-linker 154 may include $N((CH_2)xOH)y$ where the parameter x has a range from 1 to 10 and parameter y has a range from 1 to 4. Exemplary interactions between the polymer and the cross-linker may include R1OCH3+R2OH—>R1OR2+HOCH3 or R1OH+R2OH—>R1OR2+H2O.

Still referring to FIG. 20, the top layer 150 may include a second polymer 156. The second polymer 156 includes a functional unit "e" capable of absorbing imaging light during an etching process. The functional unit e may include a double bond, a triple bond, or combinations thereof. For example, the functional unit e includes a benzyl group, phenyl group, or substitute benzyl group. The second polymer 156 also includes a reaction unit "c" capable of reacting to the cross-linker 154. The second polymer 156 includes a backbone unit similar to those illustrated in FIGS. 21a and 21b and described above.

Figure 22:
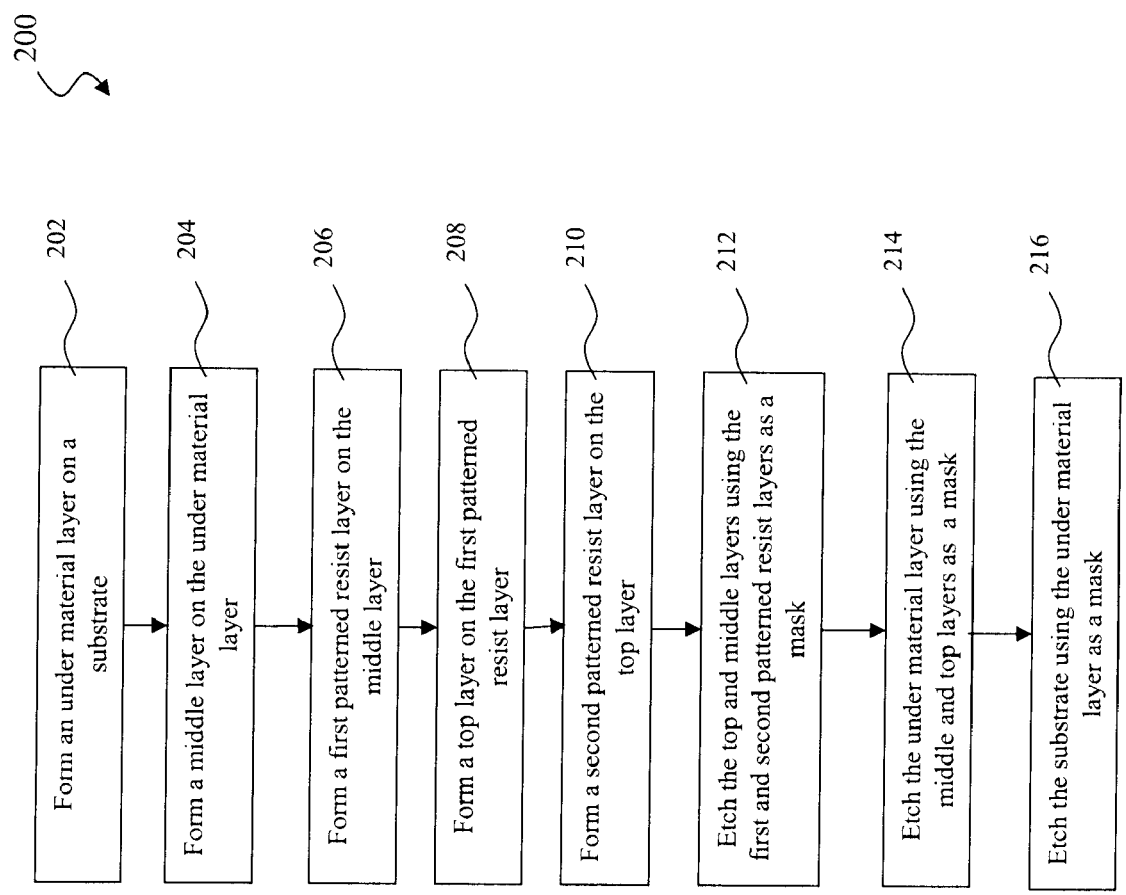
FIG. 22 is a flowchart showing one embodiment of a method of lithography patterning.

FIG. 22 is a flowchart showing an embodiment of a method 200 of lithography patterning, which is the lithography patterning described above in association with FIGS. 1-7. The method 200 begins at step 202 by forming an underlying material layer on a substrate, and then continues at step 204 by forming a middle layer on the under material layer. At step 206, a first patterned resist layer is formed on the middle layer. At step 208, a top layer is formed on the first patterned resist layer, and at step 210a second patterned resist layer is formed on the top layer. At step 212, the top and middle layers are etched using the first and second patterned resist layers as a mask. At step 214, the underlying material layer is etched using the patterned top and middle layers as a mask. At step 216, the substrate is etched using the underlying material layer as a hard mask. Various changes, substitutions, and alterations can be made in this method without departing from the spirit and scope of the present disclosure.

FIGS. 23 to 34 are sectional views showing a further device 300 at respective different stages of fabrication, where the device 300 is an alternative embodiment of the device 100 shown in FIGS. 1-7. In FIGS. 23-34, a method for lithography patterning is disclosed. FIG. 23 shows that the semiconductor device 300 includes a silicon substrate 310. The substrate 310 may alternatively be made of some other suitable material, for example as described above in association with the substrate 110.

An underlying material layer 320 is formed on the substrate 310. The material layer 320 is chosen so that it is substantially different from a hard mask layer subsequently formed above it in terms of etching rate. For example, the material layer 320 may be made of a material substantially similar to that described above for the material layer 120. The material layer 320 may alternatively include a multilayer structure. For example, the material layer 320 may include a first polymer layer and a second polymer layer disposed on the first polymer layer. The second polymer layer may include a radiation-sensitive material sensitive to the radiation beam of an exposure system such as an ultraviolet, extreme ultraviolet (EUV), or electron-beam system.

Referring to FIG. 24, a patterned resist layer 330 is formed on the underlying material layer 320. The resist layer 330 has a plurality of openings, such that portions of the material layer 320 are exposed within the openings. The patterned resist layer 330 may be substantially similar to the resist layer 130 described above, in terms of function, formation, configuration, and composition.

Referring to FIG. 25, a hard mask layer 340 is formed on the patterned resist layer 330, and in the openings thereof. The hard mask layer substantially fills the openings of the patterned resist layer 330, and thus substantially covers the portions of the underlying material layer 320 exposed within the openings of the patterned resist layer 330. The hard mask layer 340 includes a silicon-containing organic polymer, which may use a solvent different from that of the resist layer. The solvent of the hard mask layer is not capable of dissolving the resist layer 330. The hard mask layer may use an alcohol based solvent. For example, the hard mask can use butanol, isobutanol, isopentanol and/or IPA as a solvent. In one example, the silicon-containing organic polymer may include silsesquioxane (SSQ). The polymeric material may be cross-linked. The hard mask layer 340 may include a silicon-containing inorganic polymer. For example, the inorganic polymeric material may include silicon oxide. The hard mask layer may alternatively include a metal-containing organic polymer material that contains metal such as titanium, titanium nitride, aluminum, and tantalum. In another embodiment, the hard mask layer 340 may include silicon nitride or silicon oxynitride. The hard mask layer 340 may include pure silicon, such as polycrystalline silicon or silicon oxide. The hard mask layer 340 may include spin-on glass (SOG), known in the art. The hard mask layer 340 may be similar to the top layer 150 of FIG. 2 or FIG. 20.

Referring to FIG. 26, an etching process is applied to etch back the hard mask layer sufficiently so that the top surfaces of the patterned resist layer 330 are substantially exposed. The etch back process may use a $CF_4$ dry etch, or a buffered hydrofluoric acid (BHF) wet etch to etch silicon dioxide. Some other proper etchants or processes may be utilized to achieve the etching back, such as chemical mechanical polishing (CMP) process.

Figure 27:
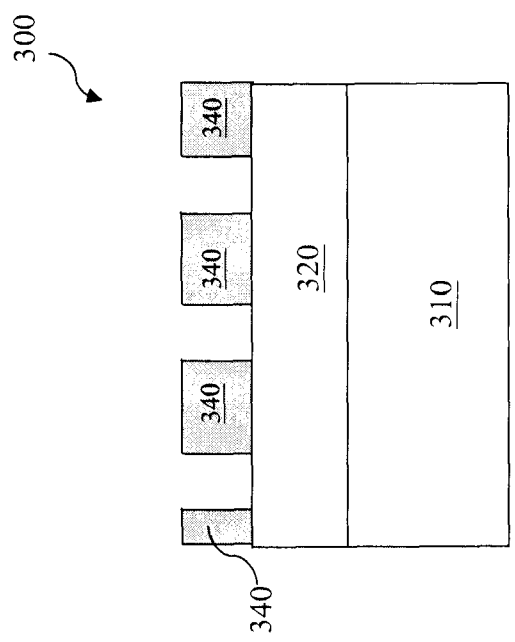

Referring to FIG. 27, the patterned resist layer 330 is removed, for example by a conventional process that can include wet stripping or oxygen plasma stripping. Thus, a reversed hard mask pattern is formed, in which the openings within the hard mask layer 340 are covered by the patterned resist layer 330 before the removal of the resist layer 330.

Figure 28:
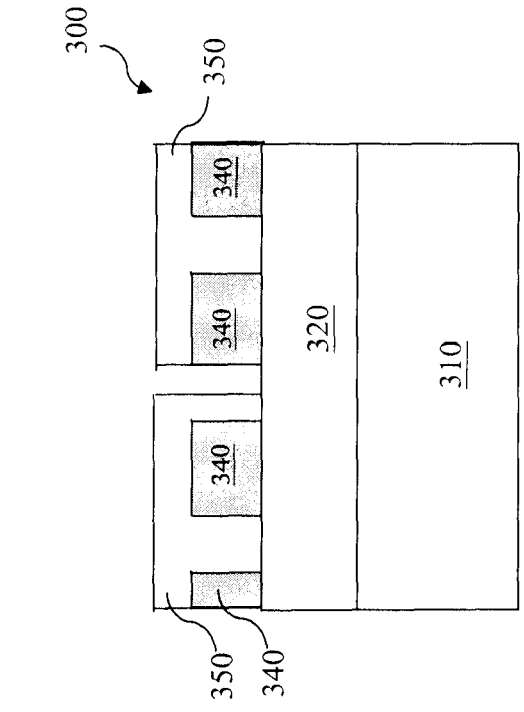

At this point, the method can continue by etching the under layer 320 through the openings in the hard mask layer 340, and then etching the substrate 310 using the under layer 320 as a mask. Alternatively, however, a procedure similar to that discussed above can be used to form another reverse pattern, as will now be described. Referring to FIG. 28, another patterned resist layer 350 is formed on the patterned hard mask layer 340, and on the portions of the material layer 320 exposed within the openings of the hard mask layer 340. The resist layer 350 includes a plurality of openings that expose portions of the material layer 320. The patterned resist layer 350 may be substantially similar to the resist layer 330 discussed above, in terms of function, formation, and composition.

Figure 29:
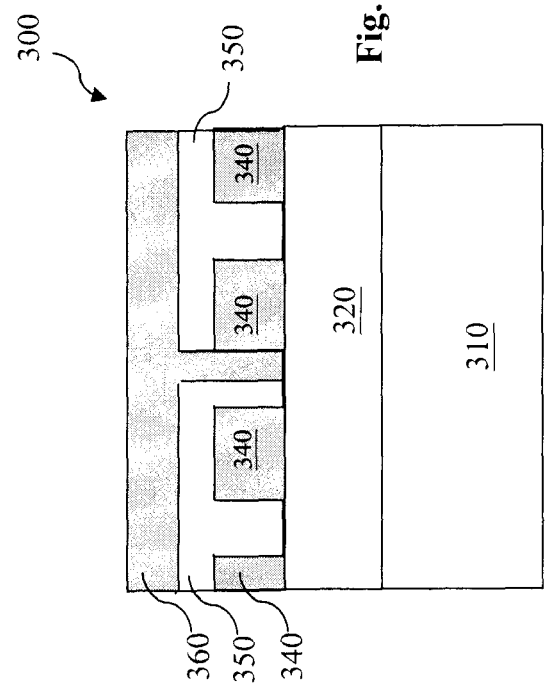

Referring to FIG. 29, another hard mask layer 360 is formed on the patterned resist layer 350, and substantially fills the openings in the patterned resist layer 350. The hard mask layer 360 substantially covers portions of the underlying material layer 320 that are exposed within the openings of the patterned resist layer 350. The hard mask layer 360 includes a silicon-containing organic polymer, which may use a solvent different from that of the resist layer. The solvent of the hard mask layer is not capable of dissolving the resist layer 350. For example, the hard mask can use butanol, isobutanol, isopentanol and/or IPA as a solvent. The polymeric material may be cross-linked. The hard mask layer 360 may include a silicon-containing inorganic polymer. For example, the inorganic polymeric material may include silicon oxide. The hard mask layer may alternatively include a metal-containing organic polymer material that contains a metal such as titanium, titanium nitride, aluminum, or tantalum. In another embodiment, the hard mask layer 360 may include silicon nitride or silicon oxynitride. The hard mask layer 360 may include pure silicon such as polycrystalline silicon or silicon oxide. For example, the hard mask layer 360 may include spin-on glass (SOG), known in the art. The hard mask layer 360 may be similar to the hard mask layer 340.

Figure 30:
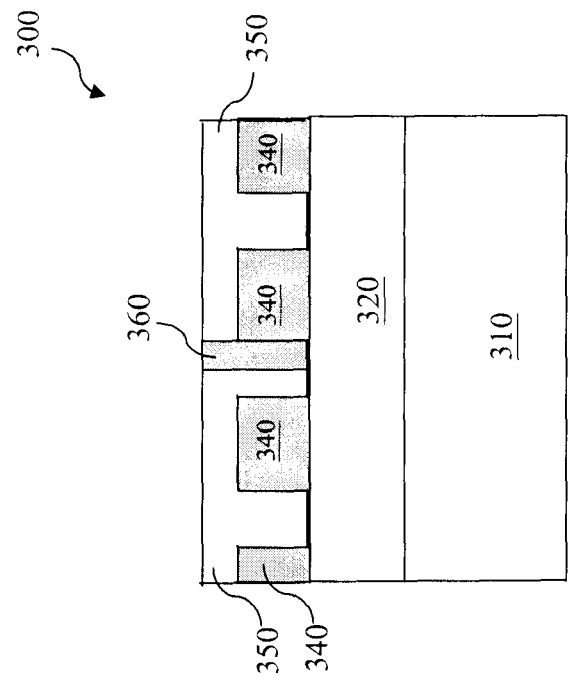

Referring to FIG. 30, an etching process is applied to etch back the hard mask layer 360 sufficiently so that the top surfaces of the patterned resist layer 350 are substantially exposed. The etch back process may, for example, use a $CF_4$ dry etch, or a buffered hydrofluoric acid (BHF) wet etch to etch silicon dioxide. Other proper process may be utilized to implement the etch back, such as chemical mechanical polishing (CMP).

Referring to FIG. 31, the patterned resist layer 350 is removed, for example by a conventional process that includes wet stripping or oxygen plasma stripping. Thus, a reversed hard mask pattern is formed, in which the under layer 320 is exposed within the openings of the patterned hard mask layers 340 and 360.

The reversed hard mask pattern can be trimmed to reduce the widths of the hard mask islands, for realizing small feature sizes. In another example, another resist layer may be applied and patterned such that a trimming process may be performed to modify the hard mask pattern within particular regions. For example, isolated trenches may be thus modified to eliminate an etching load effect. Such a reversed hard mask pattern can be incorporated into lithography patterning technologies. For example, the reversed hard mask pattern may be integrated with chromeless phase lithography. The chromeless phase lithography has high optical contrast. The chromeless mask can print better images than PSM or a binary mask. For example, a chromeless mask can print an island pattern by using a positive resist. The reverse hard mask pattern is capable of transferring the island pattern to a hole pattern with improved resolution. The method not only reverses the image pattern, but also improves the etch resistance. A silicon-containing layer can be used as a hard mask in transferring the reversed pattern to the under layer. The good etching selectivity of the silicon-containing layer with respect to the under layer enables the under layer to have a high aspect ratio. The under layer with a high thickness can achieve substrate patterning while eliminating pattern collapse and other issues. The reversed hard mask pattern utilized with double patterning techniques can be used in various applications. For example, if a line pattern can be achieved with better quality through the reversed pattern with the double patterning technique, then various contact holes can be formed with enhanced resolution.

Referring to FIG. 32, an etching process is applied to open the underlying material layer 320 if it is formed on the substrate 310. An etching process is chosen such that the underlying material layer 320 has a higher etch rate relative to the etch rate of the hard mask layers 340 and 360. For example, if the underlying material 320 includes silicon nitride, and the hard mask layers 340 and 360 include silicon oxide, a hot phosphoric acid ($H_3PO_4$) can be used to selectively remove the underlying material layer 320.

Referring to FIG. 33, another etching process is applied to etch the substrate 310 under the patterned underlying material layer 320. This etching process is chosen so that the substrate 310 is selectively etched. In one embodiment, the hard mask layer 340 and 360 is removed before the etching of the substrate 310. In another embodiment, the hard mask layer 340 and 360 may be removed along with the material layer 320 after the etching of the substrate 310. In another embodiment, if the hard mask layer is directly disposed on the substrate 310, then the etching process is chosen so that the etchant has a higher etch rate for the substrate 310 than for the hard mask layer 340 and 360. The under layer 320 may be subsequently removed by an etching process, as illustrated in FIG. 34.

Figure 35:
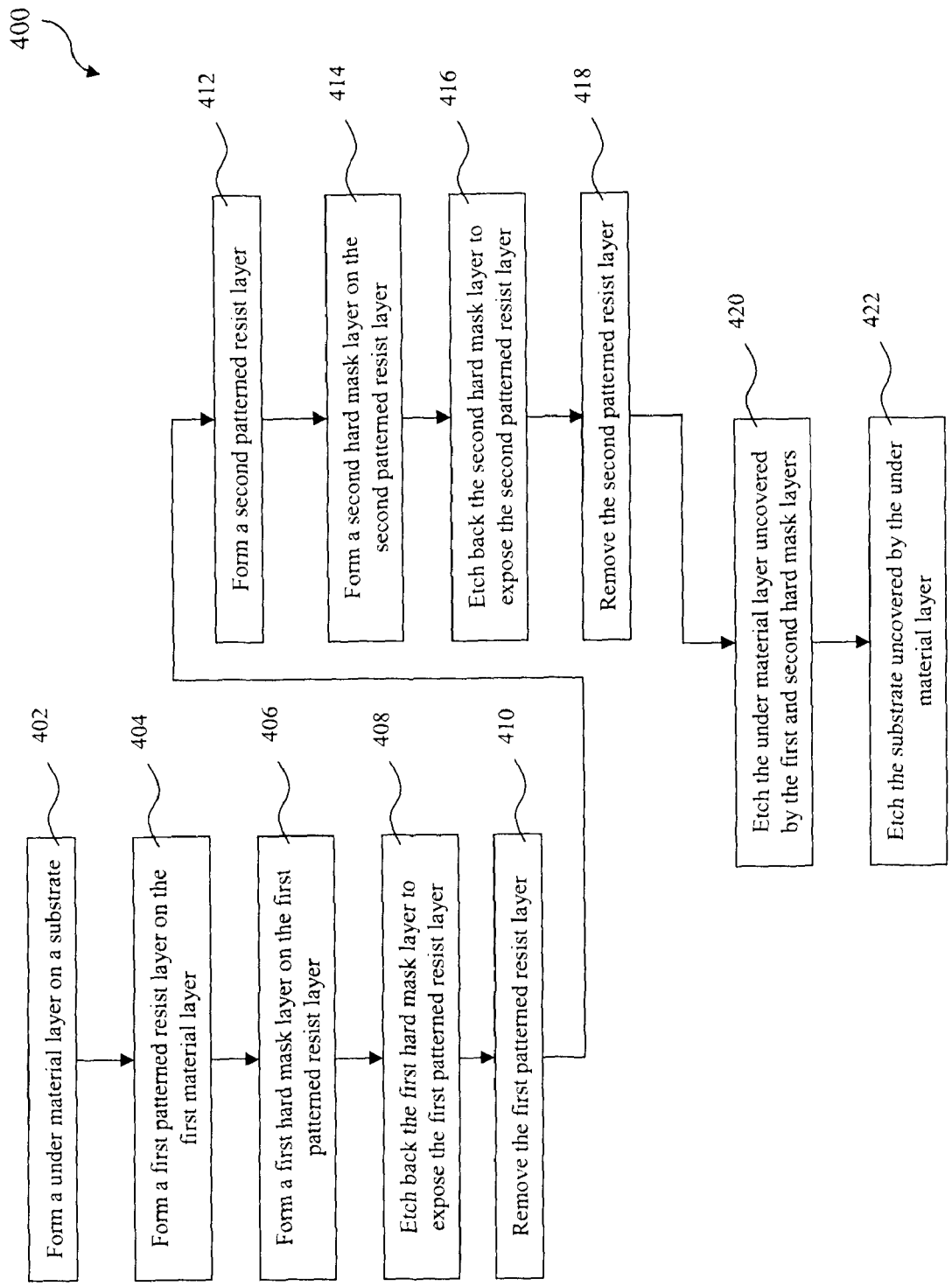
FIG. 35 is a flowchart showing another embodiment of a method of lithography patterning.

FIG. 35 is a flowchart of a method 400 for lithography patterning, where the method 400 implements the lithography patterning technique described above with respect to FIGS. 23-34. The method 400 begins at step 402 by forming an under material layer on a substrate, and then continues in step 404 by forming a first patterned resist layer on the underlying material layer. In step 406, a first hard mask layer is formed on the first patterned resist layer, and in step 408, the first hard mask layer is etched back to expose the top surfaces of the first patterned resist layer. In step 410, the first patterned resist layer is removed. The method proceeds to step 412, where a second patterned resist layer is formed on the first patterned hard mask layer and on portions of the underlying material layer exposed within the openings of the first patterned hard mask layer. In step 414, a second hard mask layer is formed on the second patterned resist layer. In step 416, the second hard mask layer is etched back to expose the top surfaces of the second patterned resist layer, and then in step 418 the second patterned resist layer is removed.

The method then proceeds to step 420, where the under material layer exposed within the openings of the hard mask layers is etched. Then in step 422, the substrate exposed within the openings of the under material layer is etched. The hard mask layers, the patterned resist layer, and the underlying material layer are removed, as described in association with FIGS. 23-34. As mentioned above, the under material layer may be alternatively avoided.

Various embodiments of a lithography patterning method and a top layer material have been introduced and described. Other modifications, variations, additions, and extensions may be used without departing from the scope of the disclosure. For example, a hardening process may be applied to one resist layer using a plasma treatment, UV curing, ion implantation, or e-beam treatment. A top layer, a middle layer, or an under layer may be cross-linked (or cured) if necessary. In another example, a resist layer and a silicon-containing (or metal-containing) material may use a different solvent to avoid mixing or interdiffusion. For example, a resist layer may use an organic solvent such as propylene glycol monomethyl ether (PGME) or propylene glycol monomethyl ether acetate (PGMEA), while the top layer may use an alcohol solvent such as butanol, isobutanol, pentanol, isopentanol, and/or IPA. All of the above techniques that include hardening, cross-linking, and utilizing different solvents may be alternatively implemented, or combined, depending on the configuration and the processing procedure.

Thus, the present disclosure provides a method of lithography patterning. The method of lithography double patterning includes forming a first material layer on a substrate; forming a first patterned resist layer including at least one opening therein on the first material layer; forming a second material layer on the first patterned resist layer and the first material layer; forming a second patterned resist layer including at least one opening therein on the second material layer; and etching the first and second material layers uncovered by the first and second patterned resist layers.

In the present method, the first and second material layers each may include one of a silicon-containing material and a metal-containing material. The first and second material layers each may include a chemical unit selected from the group consisting of Si, Ti, TiN, Ta, Al, a metal ion, a metal complex, an organic metal, and combinations thereof. The method may further include forming a third material on the substrate before the forming of the first material layer. The forming of the third material layer may include forming a polymeric material selected from the group consisting of organic polymer, resist, BARC, and combinations thereof. The method may further include etching the third material layer uncovered by the first and second material layers after the etching of the first and second material layers. The method may further include etching the substrate using the third material layer as a hard mask after the etching of the third material layer. The etching of the third material layer may include using a plasma etchant selected from the group consisting of oxygen plasma, nitrogen plasma, hydrogen, alkyl halide, and combinations thereof. The forming of the first material layer may include forming a material having a refractive index ranging between about 1.1 and 1.9, and an absorption value ranging between about 0.01 and 0.8. The forming of the patterned resist layer may include exposing the patterned resist layer utilizing a means selected from a group consisting of a Krypton Fluoride (KrF) excimer laser, an Argon Fluoride (ArF) excimer laser, extreme ultraviolet (EUV) technology, imprint technology, electron-beam technology, and combinations thereof. The forming of each of the first and second material layers may include providing a cross-linking polymeric material. The providing of the cross-linking polymeric material may include diffusing acid from the patterned resist layer to the second material layer or a baking process with a temperature in the range between about 25° C. and 150° C. The forming of one of the first and second material layers may include utilizing a hardening process.

The present disclosure also provides another method of lithography patterning. The method includes forming a first material layer on a substrate; forming a first patterned resist layer including at least one opening therein on the first material layer; forming a second material layer within the patterned resist layer, the second material layer being different from the first material layer; and removing the first patterned resist layer to form a pattern of the second material layer being complementary to the first patterned resist layer.

The disclosed method may further include opening the first material layer using the pattern of the second material layer as a mask, and may further include etching the substrate within openings of the first material layer. The first material may be substantially free of silicon and the second material may contain silicon. The first material may be substantially free of metal and the second material may contain metal. The second material layer may include a component selected from the group consisting of an organic polymer, an inorganic material, and a solvent system different from that of the first patterned resist layer. The second material may include cross-linkers. The method may further include cross-linking the second material by a thermal baking. The method may further include hardening the first patterned resist layer before the forming of the second material layer. The method may further include implementing an etch-back process to the second material layer before the removing of the first patterned resist layer. The method may further include forming a second patterned resist layer including at least one opening therein on the pattern of the second material and the substrate; forming a third material layer within the at least one opening of the second patterned resist layer; and removing the second patterned resist layer to form a pattern of the third material being complementary to the second patterned resist layer. The third material layer may be substantially similar to the first material layer. The method may further include opening the first material layer using the second and the third material layers as a mask. The forming of the first material layer may include forming a material having a refractive index ranging between about 1.1 and 1.9, and an absorption value ranging between about 0.001 and 0.8.

The present disclosure also provides another method including: forming a first patterned resist layer including at least one opening therein on a substrate; forming a first hard mask layer on the first patterned resist layer; etching back the first hard mask layer to expose the first patterned resist layer; removing the first patterned resist layer; forming a second patterned resist layer including at least one opening therein on the first hard mask layer and the substrate; forming a second hard mask layer on the second patterned resist layer and the substrate; etching back the second hard mask layer to expose the second patterned resist layer; and removing the second patterned resist layer.

The disclosed method may further include etching the substrate uncovered by the first and second hard mask layers. The etching back one of the first and second hard mask layers may include a process selected from a dry etching, a wet etching, or a combination thereof. The first and second hard mask layers each may include at least one of Si, Ti, TiN, Al, and Ta. The forming of one of the first and second hard mask layers may include forming a material selected from the group consisting of silicon, silicon oxide, silicon nitride, silicon oxynitride, and combinations thereof. The forming one of the first and second hard mask layers may include forming a silicon-containing organic polymer. The forming of the silicon-containing organic polymer may include cross-linking the silicon-containing organic polymer. The forming one of the first and second hard mask layers may include forming a silicon-containing inorganic polymer. The silicon-containing inorganic polymer may include silicon oxide. The forming one of the first and second hard mask layers may include a process selected from spin-on coating and chemical vapor deposition (CVD). The method may further include an etching process to trim the hard mask layer.

The present disclosure also provides a material utilized in photolithography patterning. The material includes: a solvent consisting of one of isobutanol and isopentanol; and a first polymer that has a first functional unit capable of enhancing etching resistance and at least one of silicon and a metal.

The disclosed material may further include a cross-linker with a plurality of first reaction units. Each first reaction unit may include a functional group selected from the group consisting of OH, COOH, anhydride, and combinations thereof. The first polymer may further include a second reaction unit. The second reaction unit may include a functional group selected from the group consisting of OH, COOH, anhydride, and combinations thereof. The material may further include a second polymer having a second functional unit capable of absorbing imaging light. The second functional unit may include at least one of a double bond, a triple bond, a tertiary carbon structure, and combinations thereof. The second functional unit may include one of a benzyl group, a phenyl group, and combinations thereof. The second polymer may further include at least one of silicon and a metal. The first and second polymers each may include a backbone unit selected from the group consisting of Si—O—Si, Si—Si, and combinations thereof. The first and second polymers each may further include various units selected from the group consisting of hydrogen, halide, a straight alkyl, a branched alkyl, a cyclic alkyl, fluorinated alkyl, silicon contain alkyl, silicon oxide contain alkyl, and combinations thereof, each being attached to the backbone unit. The first functional unit may include at least one of a double bond, a triple bond, tertiary carbon structure, and combinations thereof.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of lithography double patterning, comprising:
   forming a first material layer over a material layer to be patterned;
   forming a second material layer over the first material layer;
   forming a first patterned resist layer including at least one opening therein over the second material layer;
   forming a third material layer over the first patterned resist layer and the second material layer;
   forming a second patterned resist layer including at least one opening therein over the third material layer;
   etching the second and third material layers uncovered by the first and second patterned resist layers;
   etching the first material layer uncovered by the second and third material layers; and
   etching the material layer to be pattered uncovered by the first material layer.

2. The method of claim 1 wherein the second and third material layers each include one of a silicon-containing material or a metal-containing material.

3. The method of claim 1 wherein second and third material layers each include a chemical unit selected from the group consisting of Si, Ti, TiN, Ta, Al, a metal ion, a metal complex, an organic metal, and combinations thereof.

4. The method of claim 1 wherein the etching the material layer to be patterned partially removes the first material layer.

5. The method of claim 1 wherein the forming the first material layer includes forming a polymeric material selected from the group consisting of organic polymer, resist, BARC, and combinations thereof.

6. The method of claim 1 wherein the forming the first patterned resist layer and the second patterned resist layer includes forming at least one opening of the first patterned resist layer and the at least one opening of the second patterned resist layer to achieve pitch splitting.

7. The method of claim 1 wherein the forming the first patterned resist layer and the second patterned resist layer includes forming at least one opening of the first patterned resist layer and the at least one opening of the second patterned resist layer to achieve contact holes.

8. The method of claim 4 wherein the etching of the first material layer includes using a plasma etchant selected from the group consisting of oxygen plasma, nitrogen plasma, hydrogen, alkyl halide, and combinations thereof.

9. The method of claim 1 wherein the forming one of the second and third material layers includes forming a material having a refractive index of about 1.1 to about 1.9 and an absorption value of about 0.01 to about 0.8.

10. The method of claim 1 wherein the forming of each of the second and third material layers includes providing a cross-linking polymeric material.

11. A method comprising:
    providing a substrate;
    forming a first silicon-containing organic polymer layer over the substrate;
    forming a first patterned resist layer over the first material layer;

forming a second silicon-containing organic polymer layer over the first patterned layer and the first material layer;

forming a second patterned resist layer over the second material layer; and etching the first and second material layers by using the first and second patterned resist layers as a mask.

12. The method of claim 11 wherein the forming the first patterned resist layer and the second patterned resist layer includes configuring the first and second patterned resist layer to achieve pitch splitting.

13. The method of claim 11 wherein the forming the first patterned resist layer and the second patterned resist layer includes configuring the first and second patterned resist layer to achieve pitch splitting.

14. The method of claim 11 wherein:

the forming the first and second silicon-containing organic polymer layers includes forming the first and second silicon-containing organic polymer layers with a first solvent; and the forming the first and second patterned resist layers includes forming the first and second patterned resist layers with a second solvent, the second solvent being different than the first solvent.

15. The method of claim 11 wherein:

the forming the first patterned resist layer includes forming a first resist layer having a first pattern; and the forming the second patterned resist layer includes forming a second resist layer having a second pattern, the second pattern being different than the first pattern.

16. The method of claim 11 wherein the etched first and second silicon-containing organic polymer layers form a pattern having openings therein that expose the substrate, and including etching the substrate within the openings.

17. A method comprising:

providing a substrate;

forming a first material layer over the substrate;

forming a second material layer over the first material layer;

forming a first patterned resist layer over the second material layer;

forming a third material layer over the first patterned resist layer;

forming a second patterned resist layer over the third material layer;

etching the second and third material layers using the first and second patterned resist layers as a mask;

etching the first material layer using the etched second and third material layers as a mask; and etching the substrate using the etched first material layer as a mask.

18. The method of claim 17 wherein:

the forming the second and third material layers includes forming the second and third material layers with a first solvent; and the forming the first and second patterned resist layers includes forming the first and second patterned resist layers with a second solvent, the second solvent being different than the first solvent.

19. The method of claim 17 wherein:

the forming the first material layer includes forming the first material layer with a first etching resistance; and the forming the second and third material layers includes forming the second and third material layers with a second etching resistance, the second etching resistance being higher than the first etching resistance.

20. The method of claim 17 wherein the forming the first and second patterned resist layers includes:

forming the first patterned resist layer with first openings therein; and forming the second patterned resist layer with the second openings therein, the second openings being configured relative to the first openings to achieve a desired pattern.

\* \* \* \* \*